United States Patent [19]
Hack et al.

[11] Patent Number: 5,945,177
[45] Date of Patent: Aug. 31, 1999

[54] PROCESS FOR COATING AN EXTERIOR PORTION OF A LAMP

[75] Inventors: Hrabanus Hack, Mainz; Torsten Holdmann, Woellstein; Volker Paquet, Mainz; Johannes Segner, Stromberg, all of Germany

[73] Assignee: Schott Glaswerke, Mainz, Germany

[21] Appl. No.: 08/991,920

[22] Filed: Dec. 16, 1997

[30] Foreign Application Priority Data

Dec. 17, 1996 [DE] Germany .................. 196 52 454

[51] Int. Cl.$^6$ .............. B05D 3/06; B05D 5/06; H01K 3/00
[52] U.S. Cl. .............. 427/575; 427/576; 427/66; 427/67; 427/69; 427/109
[58] Field of Search .................. 427/66, 67, 69, 427/109, 575, 576

[56] References Cited

U.S. PATENT DOCUMENTS 4,940,636  7/1990  Brock et al. .

FOREIGN PATENT DOCUMENTS

| 0 305 135 A2 | 3/1989 | European Pat. Off. . |
| 0 369 254 A2 | 5/1990 | European Pat. Off. . |
| 0 409 451 A1 | 1/1991 | European Pat. Off. . |
| 36 32 748 C2 | 4/1989 | Germany . |
| 10-188917 | 7/1998 | Japan . |

OTHER PUBLICATIONS

"Application of Thin Film Reflecting Coating Technology to Tungsten Filament Lamps", by R.S. Bergman, T. G. Parham, IEE Proceedings–A, vol. 140, No. 6, Nov. 1993.

"Multilayer Barrier Coating System Produced by Plasma–Impulse Chemical Vapor Deposition (PICVD)", by M. Walter et al, in Surface and Coating Technology 80, 1996, pp. 200–202. No month data!.

"Handbuch der Vakuumelektronic", by J. Eichmeier, H. Heynisch, Oldenbourg Verlag, Muenchen, Wien 1989, Kapitel 10.1.2, pp. 594–598. No month data!.

*Primary Examiner*—Roy V. King
*Attorney, Agent, or Firm*—Michael J. Striker

[57] ABSTRACT

A process for coating an exterior of a lamp is disclosed, which comprises performing the coating in a microwave reactor by a microwave plasma CVD process and coupling microwave radiation into the microwave reactor with a microwave power greater than or equal to a power threshold value at which a plasma with reduced microwave permeability is ignited in the microwave reactor.

13 Claims, 3 Drawing Sheets

PROCESS FOR COATING AN EXTERIOR PORTION OF A LAMP

BACKGROUND OF THE INVENTION

The present invention relates to a process for exterior coating a lamp, i.e. for providing a coating on an exterior or outside portion of it. The invention also relates to an apparatus for exterior coating of lamps and, more particularly, to an apparatus for coating an exterior portion of a lamp including a reactor chamber in which the lamp is arranged and a device for conducting a coating gas into and out of the reactor chamber.

The exterior coating of glass bodies is of interest especially for incandescent lamps, because the spectrum of the radiation emitted by the lamp may be influenced because of it in order for example to obtain a certain color effect or in order to reduce the energy consumption of the lamp.

Incandescent lamps radiate a large portion of their input energy in the form of thermal radiation and not as light. In order to utilize the undesirable thermal radiation it is known to reflect the thermal radiation back to the filament by a infrared reflective coating applied to the outer surface of the lamp and thus to reduce the energy consumption required for maintaining its operating temperature. This is, for example, described in IEE Proceedings-A, Vol. 10, No. 6, November 1993, p. 418.

The proportion of the thermal radiation produced by an uncoated halogen lamp amounts to at least 80%. If a halogen lamp is provided with a suitable coating, the energy consumption may be reduced theoretically to about 32% of the energy consumption of an uncoated lamp. According to the current state of the art the proportion of the thermal radiation is always still at 70%. There is thus a great interest in further development of coatings for incandescent lamps.

The coating generally comprises a multi-layer interference system of high-refractive and low-refractive layers, advantageously low-refractive $SiO_2$ and high-refractive $TiO_2$ or $Ta_2O_5$ layers.

The layers were applied according to different methods on the incandescent lamp. An expensive dipping method is disclosed in European Patent Application EP 0 305 135 and a CVD method is disclosed in European Patent Application 0 369 253. $Ta_2O_5$ or $SiO_2$ layers are formed on the lamp by means of a direct current-cathode sputtering in a PVD process according to European Patent application EP 0 409 451, in which an oxidation is performed after deposition of a thin layer of Ta or Si. These steps are performed one after the other until the resulting Ta or Si oxide layer has reached the required thickness.

These known methods have the disadvantage of a long duration processing time lasting several hours for making the layer packet with the risk of a failure of plant components proportional to the processing time. Only layers with comparatively low refraction number can be applied by means of a dipping method and the CVD method, so that the total number of layers of packets must be increased in order to obtain the required IR reflection. The mechanical expense is very large in the PVD method according to European Patent Application EP 0 409 451, and also the susceptibility for trouble is increased.

German Patent Application DE 3632748 C2 describes a method of coating, especially of coating the interior of a hollow body with a polymeric coating by plasma polymerization. The hollow body is inserted in a microwave chamber, in which microwaves are supplied from the exterior to several locations, so that a homogeneous electric field exists in the chamber. Either monomers provided for the coating or a mixture of monomers and a plasma carrier are conducted into the interior of the hollow body by means of a nozzle shielded from the microwaves, so that a plasma is ignited and the plasma polymerization can be performed. A hollow body having an outer layer of metal is mentioned in this pre-publication, as in "Surface and Coatings Technology", 80, pp. 200–202 (1996), where a PICVD method for making a layers system sufficiently uniform for application as a diffusion blocking layer on the inner surface of a plastic container is described. Although microwave-plasma-CVD methods are suitable basically for coating of glass bodies, these methods were not used up to now for coating the exterior of glass bodies, which have metal components, such as incandescent lamps. The reason is possibly the fear that the conductive regions such as the lamp filament and the connector pins would perturb the original field distribution by reflections.

Another reason is probably that the preferred lamps to be coated are halogen lamps whose power limit is typically about 60 watts, microwave CVD plasmas however operate in the power range of 100 watt to several kilowatts. If the power from the microwave is coupled into the metallic components of the lamp, melting can destroy these components.

Another reason is that a plasma can be excited in the interior of the halogen lamp. Plasmas can be produced with microwaves in a large pressure range from $10^{-3}$ Pa to atmospheric pressure. The gas in the interior of the halogen lamp is at atmospheric pressure and can be excited to a Br- or I-containing plasma with microwaves in contrast to other excitation frequencies, which destroys the lamp filament and can dirty the interior surface of the lamp.

SUMMARY OF THE INVENTION

It is thus an object of the present invention to provide a process and apparatus for high-quality coating of one or more layers on an exterior portion or surface of a lamp, which can be performed in a simple manner in a comparatively short processing time.

According to the invention, the coating process is performed in a microwave reactor by means of a microwave-plasma-CVD method. It has been surprisingly found that a microwave-plasma-CVD process is suitable for coating of glass bodies having metal elements, such as incandescent lamps, despite the previous considerations of those skilled in the art. These microwave-plasma-CVD processes are particularly appropriate when two criteria have been satisfied which depend on the total configuration of the microwave unit, the size and shape of the lamp to be coated and also the properties of the coating gas. These criteria are that: (1) the microwave power coupled into the microwave reactor should be greater than a power threshold value at which a plasma with reduced permeability for microwaves is set up, and (2) the rate of increase and decrease of microwave power during turn-on and turn-off of microwave power must be greater than 1/50 kW/ms.

Damage to the lamp to be coated is advantageously prevented when the microwave power coupled into the microwave reactor is selected to be greater than the power threshold value at which a plasma with reduced permeability for microwaves is ignited.

These plasmas, which are characterized by an electron density $>10^{10}$ l/cm$^3$ for microwave radiation at a frequency of 1 to 3 GHz, are, for example, described in "Plasmatechnik: Grundlagen, Anwendungen, Diagnostik (Plasma Engineering: Fundamentals, Applications, Diagnostics)" by Gerd Janzen, Heidelberg, Hüthig, 1992, p. 294 ff. A plasma of this type is present when the microwave frequency is less than the plasma frequency, which depends again on the electron densities in the plasma.

The invention makes use of this plasma property, since the microwave power is adjusted so that the lamp is protected by the plasma that is located in front of the microwave radiation, so that no heating of the metal parts and thus no damage occurs. Also no plasma is ignited inside the lamp being coated.

It has been shown that the power threshold value depends on many parameters, such as pressure, composition of the coating gas, structure of the lamp, arrangement of the lamp in the reactor, type of reactor, presence of an auxiliary discharge as an ignition aid, adjustment of fittings for the microwave and so forth, so that the power threshold value must be determined experimentally. This power threshold value can be measured by setting the microwave power at successive different values which may be adjusted for the typical duration of a coating and subsequently measuring the temperature of the filament of the lamp after shutting off the microwave. High temperatures result when the microwave power lies below the threshold value.

If the lamp is exposed to microwave power under the threshold value for too long, its filament, for example, will be heated too much.

In order to prevent damage to the lamp to be coated during turn-on and turn off of the microwave power when the microwave power is above the threshold value, the rate of increase or decrease of the power at the time it is turned on or off should preferably be greater than or equal to 1/50 kW/ms.

An arrangement is preferably selected, in which the plasma can operate as the inner conductor of a coaxial microwave conductor and the lamp to be coated is inside the inner conductor region.

Lamps with an individual layer or with several layers, e.g. a multi-layer interference system, may be coated with the method of the invention. The interference system is preferably a system, which reflects the IR radiation of the filament back to it. The lamps to be coated are preferably halogen lamps with typical cone-shaped, cylindrical, pipe-shaped, or ellipsoidal lamp bodies, in whose center the filament is located and whose current supply occurs by two contact pins in one or two pinches of the lamp.

Preferably the coating gas is conducted in the propagation direction or opposite to the propagation direction of the microwaves in the reactor chamber. A symmetrical gas distribution is obtained because of that in the reactor chamber.

Further under this prerequisite the symmetry axis of the lamp is aligned parallel to the flow direction of the coating gas in the microwave reactor. Because of this a symmetric plasma is produced inside the reactor chamber which then guarantees a symmetric shielding of the lamp from the microwaves.

When a constant burning microwave plasma is employed for coating formation, the coating rate drops in the flow direction of the coating gas and the thickness of the layer produced on the lamp has a corresponding behavior, in so far as its axis and the direction of the microwave propagation are arranged in the flow direction. This type of behavior is suitable for making a multicolored illuminating lamps. In order to make the coating increasingly colorless, i.e. uniform, the microwaves preferably are propagated in a direction opposite to the flow direction of the supplied coating gas. Furthermore the microwave power can be reduced and/or the mass flow of the coating gas increased instead of this or in addition to it.

Preferably a PICVD process is used in which pulsed microwaves are radiated into the reactor. The microwave PICVD process has the following advantages:

comparatively high process pressure and avoidance of exacting vacuum techniques;

high coating rate;

high refraction number and good coating stoichiometry; and possibility of individual location coating, so that scalability is no problem.

Particularly very uniform layers are made with the PICVD process (Plasma Pulse CVD Process). An IR reflective coating, for example made from $SiO_2$ and $TiO_2$ layers, applied to the outer surface of an incandescent lamp by the PICVD process is characterized by a very good temperature resistance of mechanical and optical properties besides a high degree of uniformity. A high refractive number for the highly refractive layers is obtained so that the layer system can be constructed with comparatively few layers—and thus very economically. The specifications of the IR reflective multi-layer system in halogen lamps may be fulfilled thus in a simple way.

The pulsed microwaves fed into the reactor chamber preferably comprise a plurality of steep-sided, advantageously rectangular, microwave pulses. The flanks or sides of the pulses should have a slope greater than or equal to 1/50 kW/ms. This is important in as much as the time during which the lamp is exposed to the microwave.

Furthermore the pulse interval between two microwave pulses should be selected at least large enough so that a gas content of a reaction volume can be exchanged with the reacted coating gas. Because of that a very good uniformity of the coating is attained. If the mass flow of the coating gas is MF (mbar×l/s), the pressure in the reactor is p (mbar) and the reactor volume is V(l), then the time t between two successive microwave pulses is approximately $$t > Vxp/MF.$$

The duration of the microwave pulse should be selected between 0.1 and 10 ms, preferably between 0.3 and 2 ms, and the pressure p in the reactor between 0.1 and 10 mbar, preferably between 0.2 and 1.5 mbar. The limits for the duration ID and pressure p result from the following limiting conditions:

ID: The layer formation process requires a minimum time of the order of 0.1 ms.

P: Pressures substantially less than 0.1 mbar require powerful and thus expensive pumps and make the process thus uneconomical. The quality of the coatings, which are made at pressures greater than about 10 mbar, is reduced because the homogeneous reaction (particle formation) increasingly predominates.

The mass flow of the coating gas per unit area of reactor cross-section is advantageously is from 0.015 to 1.5 mbar× l/s/cm$^2$. Below the lower limit the coating process lasts too long and is thus uneconomical. Above the upper limit the coating quality is poor.

Although the elements of area on the lamp have different spacing from the elements of area at the boundaries of the reactor chamber and enclosed gas volumes from which the coating components originate are of different size, good uniformity can be obtained without adjusting or dimensioning the reactor components to fit the dimensions of the lamp. This is thus of significance because different shaped lamps can be coated with the same arrangement or apparatus.

It is obviously sufficient to obtain a coating of sufficiently great uniformity when the region of the lamp to be coated is arranged at a sufficiently large distance from the reactor wall. It was found that this minimum distance $D_{min}$ is pressure dependent. It amounts to about 3 mm at a minimum pressure $P_{min}$ of 0.35 mbar. Its pressure dependence is an approximate consequence of the law: $D_{min} \times P_{min} = 1$ mm×mbar.

The pressure in mbar in the interior of the microwave reactor is equal to $P_{min} \cong 1/D_{min}$, wherein $D_{min}$, the minimum distance of the lamp from the wall of the microwave reactor, is in mm.

The apparatus according to the invention is characterized by a microwave reactor which comprises a reactor chamber, which has means for aligning the lamp with its symmetry axis parallel to the flow direction of the coating gas, which has at least one boundary wall of the microwave reactor comprising a perforated plate for supply and/or withdrawal of coating gas and also by a microwave generator for setting the microwave power and for setting a predetermined rate of increase and decrease of microwave power during turning on and off of the microwave power.

The perforated plate preferably is located above or below the lamp to be coated, which is arranged perpendicularly to the perforated plate. The perforated plate is preferably arranged perpendicular to the microwave guide or the microwave antenna.

Preferably two opposing boundary walls each have a perforated plate so that the coating gas can be supplied through one of the perforated plates and can be exhausted or withdrawn through the other. Also the lamp to be coated is arranged perpendicular to both perforated plates in this embodiment. Both perforated plates are preferably arranged parallel to each other.

The lamp can be held in one of the perforated plates by suitable holding means provided in it.

BRIEF DESCRIPTION OF THE DRAWING

The objects, features and advantages of the present invention will now be explained in further detail with the following detailed description with reference to the accompanying drawing, in which.

DESCRIPTION OF THE PREFERRED EMBODIMENTS

Figure 1:
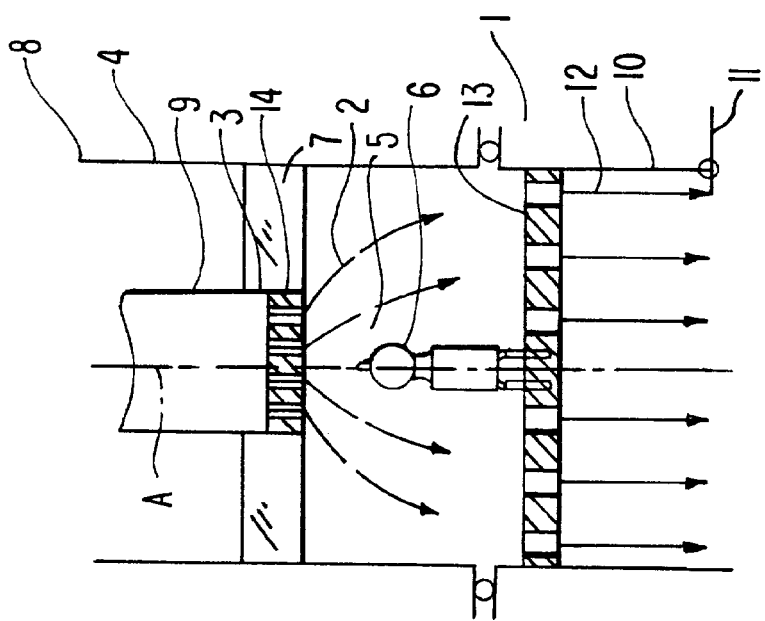
FIG. 1 is a diagrammatic vertical cross-sectional view through one embodiment of an apparatus for coating an exterior portion of a lamp according to the invention having two perforated plates.

One embodiment of an apparatus for coating an external surface of a lamp is shown in FIG. 1. This apparatus includes a microwave reactor 1. Microwaves are fed from above through the coaxial guide or microwave waveguide 4 formed from an outer tube 8 and an inner tube 3. A perforated plate 14 covers the open end of the inner tube 3 and a dielectric seal 7 is arranged between the inner tube and the outer tube. The reactor chamber 5, in which the lamp 6 to be coated is arranged on a second perforated plate 13, is located under the perforated plate 14 and the seal 7. Both perforated plates 13, 14 are oriented perpendicular to the coaxial guide 4.

The coating gas 2 is conducted through the inner conductor 3 of the coaxial guide or microwave waveguide 4 through the perforated plate 14 into the reactor chamber 5. The perforated plate is designed so that a uniform outflow of coating gas is guaranteed. The lamp is arranged centrally inside the reactor chamber and both perforated plates 13 and 14 are arranged symmetrically, so that the symmetry axis A of the lamp is aligned or arranged parallel to the coating gas flow direction as shown by the arrows at the bottom of FIG. 1, whereby a uniform surrounding flow of coating gas around the lamp is guaranteed. The coating gas in the reactor chamber 5 is excited into the plasma state by the apparatus and the coating formation begins. No plasma is ignited in the chamber or space 9 because of the presence of the dielectric seal 7 and because the space 9 between the inner tube 3 and the outer tube 8 is filled with, e.g. a gas under a pressure below atmospheric pressure. An insulated igniting electrode 11 is guided through a bounding wall 10 of the reactor chamber 5, which is connected to an unshown high voltage source, operates to ignite the plasma reliably in the reactor chamber 5. The reacted or exhaust coating gas 12 is withdrawn through the lower perforated plate 13 by means of an unshown vacuum pump.

The microwave power is adjusted so that the power threshold value for the entire arrangement is exceeded and the plasma has an electron density greater than $10^{10}$ l/cm$^3$. The coating process can be performed with the parameters according to examples 1 and 2.

EXAMPLE 1

A halogen lamp (made from quartz glass) is electrically connected in a socket, which is inserted in a base plate under a gas feed device with adjustable orifices. The coating gas flows coaxial to the symmetry axis of the lamp. A clear, highly efficient and maintainable infrared reflective layer packet was made with the following process parameters:

Pressure: 0.35 mbar

Mass flow of coating gas ($O_2$+TiCl$_4$ or HMDSO): 3.4 mbar×l/s

Pulse duration: 0.6 ms

Pulse interval: 22 ms

MW pulsed power: 2.7 kW

EXAMPLE 2

The lamp to be coated is inserted in the MW inner tube in another embodiment so that the lamp is located in the vicinity of the greatest field strength. In this case good results were obtained with the following parameters:

Pressure: 0.6 mbar

Mass flow of coating gas ($O_2$+TiCl$_4$ or HMDSO): 5.9 mbar×l/s

MW power: 2.7 kW

Figure 2:
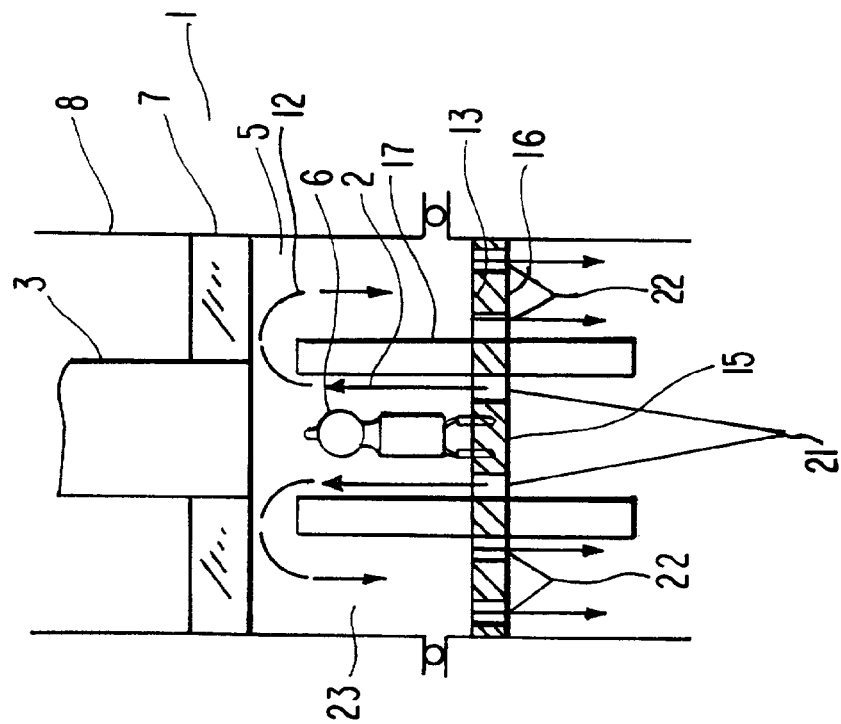
FIG. 2 is a diagrammatic vertical cross-sectional view through another embodiment of the apparatus for external coating with one perforated plate.

An apparatus is shown in FIG. 2 with which the coating gas is not supplied from above but through the lower perforated plate 13. The lamp 6 attached to this lower perforated plate 13 is surrounded by openings 21 in the plate 13, through which the coating gas flows. The symmetry axis of the lamp 6 is aligned parallel to the flow direction of the coating gas also in this embodiment. The input coating gas or the reacted coating gas is conducted into the vicinity of the dielectric seal 7. A cylinder 17 inside the reactor chamber 5 separates fresh coating gas and reacted coating gas portions from each other. The reacted coating gas is exhausted or drawn out through the annular chamber surrounding the cylinder 17 through the lower perforated plate 13. Here openings 22 are provided in the perforated plate 13, which open to the exterior region 16.

Figure 3:
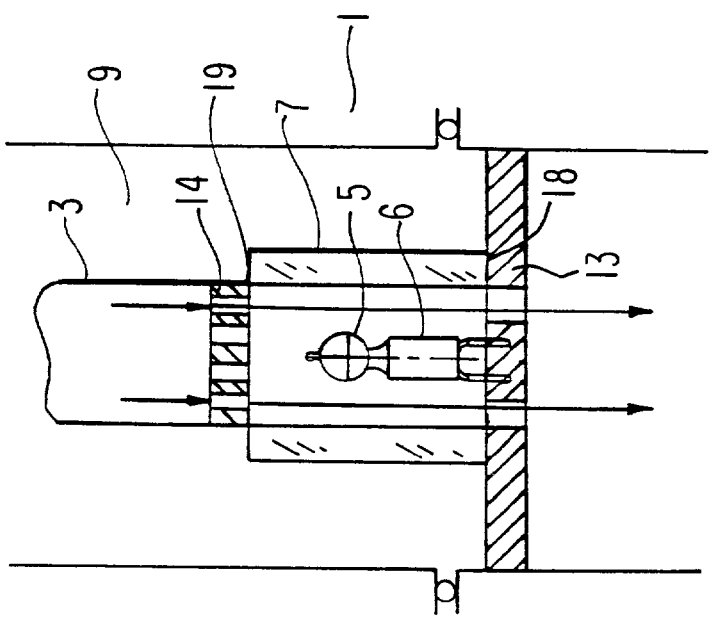

The dielectric seal 7 is not horizontally oriented in the embodiment of FIG. 3, but instead is vertical and surrounds the reactor chamber 5. The dielectric seal 7, which separates the annular space 9 from the reactor chamber 5, comprises an easily exchangeable cylinder, which is pressed on the lower perforated plate 13 and the inner tube 3 by the sealing elements 18 and 19. The plasma burning in the reactor can appear as a continuation of the inner tube 3 so that the device can be suitable as a coaxial microwave guide until at the lower perforated plate 13. The lamp 6 is thus shielded effectively from the microwaves.

In an apparatus according to FIG. 3 a lamp 6 made of hard glass was coated with the following apparatus configuration:

Outer diameter of the inner tube 50 mm
Inner diameter of the outer tube: 80 mm
Spacing of the lamp from the reactor wall: 12.5 mm
Arrangement of the lamp in the reactor chamber: central
Connection between the lamp and base plate: conducting
Process pressure: 0.35 mbar
Pulse duration: 0.6 ms
Pulse interval: 26 ms
Mass flow of the coating gas, ($O_2$+$TiCl_4$): 5.9 mbar×l/s In order to guarantee reliable ignition, an auxiliary discharge may be ignited during the coating by means of an ignition electrode mounted under the base plate to which a voltage of 3 kV is applied (50 kHz). Only when microwave pulse power >1.8 kW (the maximum pulse power amounts to 3000 W), the lamp is not destroyed and an unobjectionable coating is possible. The threshold value thus amounts to 1.8 kW.

Figure 4:
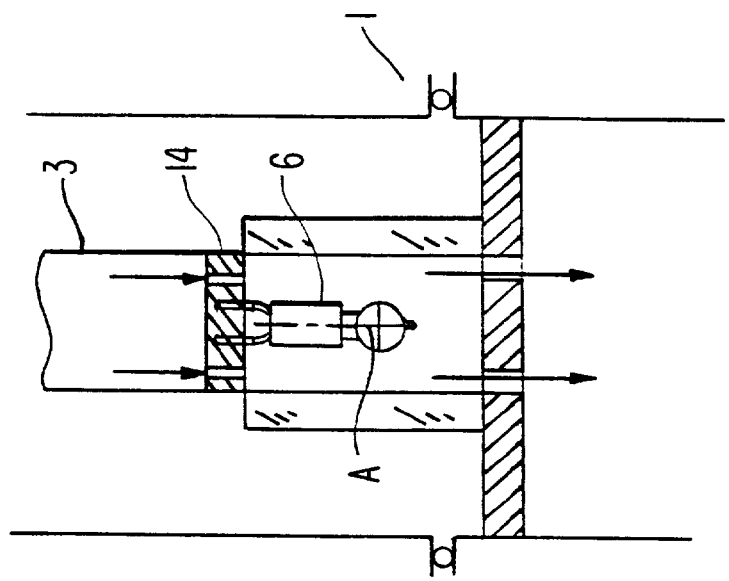
FIGS. 3 and 4 are respective diagrammatic vertical cross-sectional views through other embodiments of the apparatus according to the invention with an internal plasma conductor arrangement.
Figure 5:
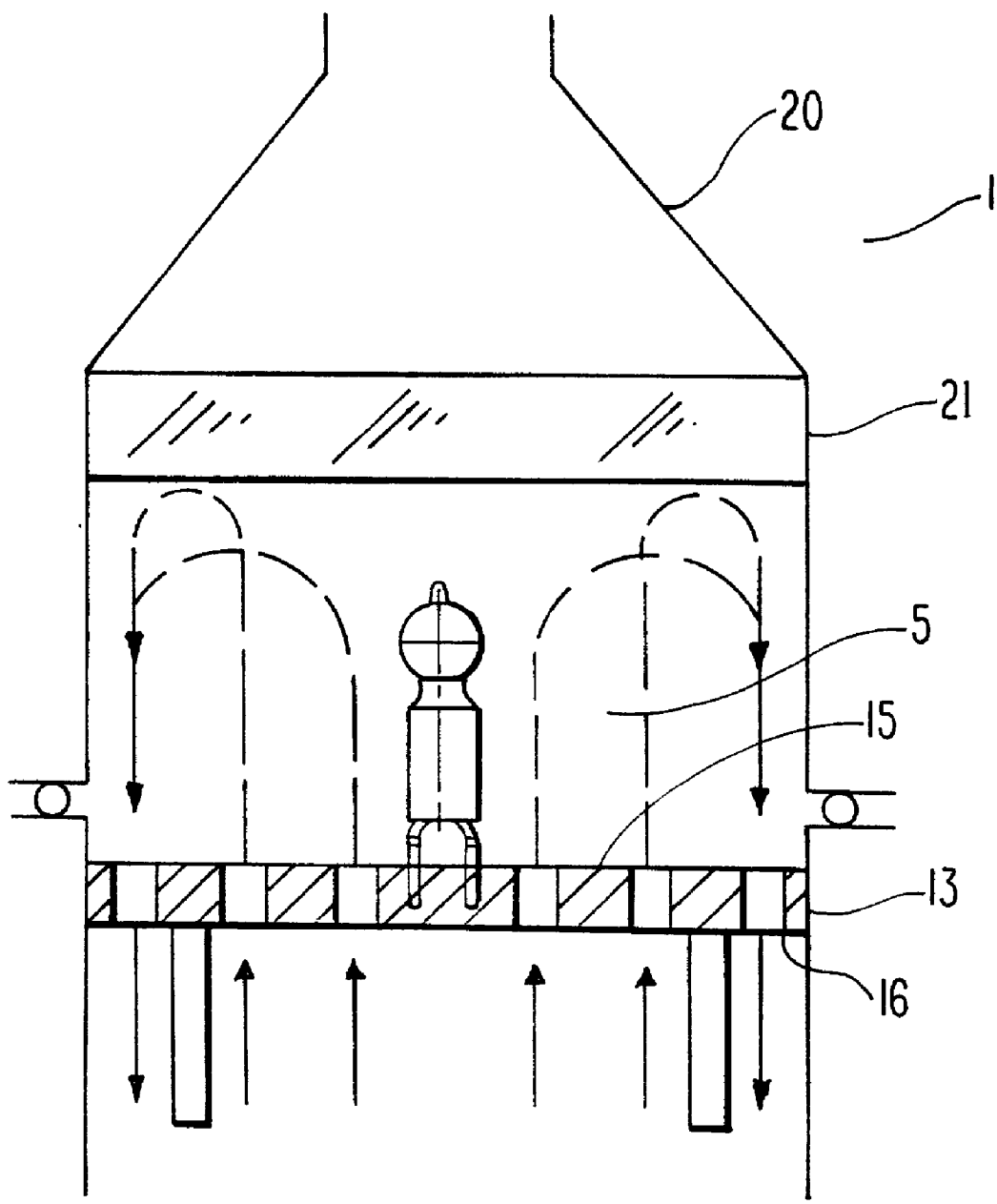
FIG. 5 is a diagrammatic vertical cross-sectional view through an additional embodiment of the apparatus for coating an external portion of a lamp according to the invention having one perforated plate.

The embodiments according to FIGS. 4 and 5 differ from that of FIG. 3 only because the lamp 6 is not arranged on the lower perforated plate but on the upper perforated plate 1 that forms the exhaust plate for the inner tube 3.

An antenna 20 radiates the microwave energy, e.g. a horn radiator, through a dielectric window 21 into the reactor chamber 5 in the embodiment of FIG. 5. The coating gas is supplied through the lower perforated plate 13 in the region 15 according to FIG. 2 and exhausted through the region 16 of the perforated plate.

In the embodiments shown the lamp 6 preferably is connected electrically by means of a pin with the perforated plate or the inner conductor or tube 3, e.g. in a hole provided for that. In all embodiments shown the gas flow direction can be reversed, i.e. the gas inlet can be made the gas outlet, and vice versa.

The disclosure of German Patent Application 196 52 454.7-33 of Dec. 17, 1996 is hereby explicitly incorporated by reference. This German Patent Application discloses the same invention as described herein and claimed in the claims appended hereinbelow and is the basis for a claim of priority for the instant invention under 35 U.S.C. 119.

While the invention has been illustrated and described as embodied in a process and apparatus for coating an exterior portion of a lamp, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims.

We claim:

1. A process for coating an exterior of a lamp, said process comprising the steps of:
    a) performing the coating in a microwave reactor by means of a microwave plasma-CVD-process; and
    b) coupling microwave radiation into the microwave reactor with a microwave power greater than or equal to a power threshold value at which a plasma with reduced microwave permeability is ignited in the microwave reactor.

2. The process as defined in claim 1, wherein said plasma with reduced microwave permeability has an electron density >$10^{10}$ 1/$cm^3$ at a microwave radiation frequency of 1 to 3 GHz.

3. The process as defined in claim 1, further comprising turning said microwave radiation supplied to said microwave reactor on and off so that said microwave power in said microwave reactor rises or falls at a rate greater than or equal to 1/50 kW/ms when said microwave radiation is turned on or off respectively.

4. The process as defined in claim 1, further comprising providing a coaxial microwave waveguide including an inner tube in the microwave reactor and mounting the lamp to be coated in the vicinity of the inner tube.

5. The process as defined in claim 4, further comprising providing a reactor chamber in the microwave reactor, feeding the microwave radiation into the reactor chamber of the microwave reactor and feeding a coating gas into the reactor chamber and/or withdrawing said coating gas from the reactor chamber in a propagation direction of the microwave radiation through the reactor chamber or opposite to the propagation direction of the microwave radiation.

6. The process as defined in claim 5, further comprising aligning a symmetry axis of the lamp to be coated parallel to a coating gas flow direction in the microwave reactor.

7. The process as defined in claim 6, wherein the propagation direction of the microwave radiation is opposite to the coating gas flow direction.

8. The process as defined in claim 1, wherein said microwave plasma-CVD-process is a plasma-impulse chemical vapor deposition (PICVD)-process.

9. The process as defined in claim 8, wherein said microwave radiation comprises a plurality of microwave pulses and wherein each of said pulses has sides which rise or fall at a rate greater than or equal to 1/50 kW/ms.

10. The process as defined in claim 9, wherein each of said microwave pulses is rectangular-shaped.

11. The process as defined in claim 9, further comprising selecting a time interval between two of said microwave pulses large enough so that a gas content of a reaction volume in the microwave reactor is replaced with an unreacted portion of the coating gas.

12. The process as defined in claim 9, further comprising providing a pressure $P_{min}$ in mbar in an interior of the microwave reactor equal to about $1/D_{min}$, and wherein said $D_{min}$ is a minimum distance of the lamp from a bounding wall of the microwave reactor in mm.

13. A microwave-plasma-CVD process for coating an exterior of a lamp, said process comprising the steps of:

a) providing a microwave reactor including a reactor chamber and a coaxial microwave waveguide for microwave radiation connected to the reactor chamber to conduct said microwave radiation to the reactor chamber;

b) coupling said microwave radiation into the microwave reactor with a microwave power greater than or equal to a power threshold value at which a plasma with reduced microwave permeability is ignited in the microwave reactor;

c) turning said microwave power supplied to said microwave reactor on and off so that said microwave radiation comprises a plurality of microwave radiation pulses and said microwave power of each of said pulses rises or falls at a rate greater than or equal to 1/50 kW/ms when said microwave power is turned on or off;

d) mounting the lamp to be coated in the vicinity of the microwave waveguide in the reactor chamber; and e) feeding a coating gas into the reactor chamber and/or withdrawing said coating gas from the reactor chamber in a propagation direction of the microwave radiation through the reactor chamber or opposite to the propagation direction of the microwave radiation to form at least one coating layer on the lamp.

* * * * *